(12) United States Patent
Zhang et al.

(10) Patent No.: US 11,127,442 B2
(45) Date of Patent: Sep. 21, 2021

(54) DATA TRANSFERS BETWEEN A MEMORY AND A DISTRIBUTED COMPUTE ARRAY

(71) Applicant: Xilinx, Inc., San Jose, CA (US)

(72) Inventors: Xiaoqian Zhang, San Jose, CA (US); Ephrem C. Wu, San Mateo, CA (US); David Berman, San Jose, CA (US)

(73) Assignee: Xilinx, Inc., San Jose, CA (US)

(*) Notice: Subject to any disclaimer, the term of this patent is extended or adjusted under 35 U.S.C. 154(b) by 91 days.

(21) Appl. No.: 16/706,437

(22) Filed: Dec. 6, 2019

(65) Prior Publication Data

US 2021/0174848 A1 Jun. 10, 2021

(51) Int. Cl.
*G11C 7/10* (2006.01)
*G06N 3/06* (2006.01)
*G11C 7/22* (2006.01)

(52) U.S. Cl.
CPC ............ *G11C 7/1084* (2013.01); *G06N 3/06* (2013.01); *G11C 7/1048* (2013.01); *G11C 7/1057* (2013.01); *G11C 7/222* (2013.01)

(58) Field of Classification Search
CPC ... G11C 7/1084; G11C 7/1048; G11C 7/1057; G11C 7/222; G06N 3/06
See application file for complete search history.

(56) References Cited

U.S. PATENT DOCUMENTS

| | | | |
|---|---|---|---|
| 2018/0217888 A1* | 8/2018 | Colgrove | G06F 11/076 |
| 2018/0350445 A1* | 12/2018 | Linnen | G11C 7/22 |
| 2019/0050717 A1 | 2/2019 | Temam et al. | |
| 2019/0114535 A1 | 4/2019 | Ng et al. | |
| 2019/0121784 A1 | 4/2019 | Wilkinson et al. | |
| 2020/0004701 A1* | 1/2020 | Subbarao | G06F 3/0656 |
| 2021/0124626 A1* | 4/2021 | Manula | G06F 9/52 |

OTHER PUBLICATIONS

Wu Ephrem et al: "A high-throughput reconfigurable processing array for neural networks", 2017 27th International Conference on Field Programmable Logic and Applications (FPL), Ghent University, Sep. 4, 2017 (Sep. 4, 2017), pp. 1-4.
"Virtex UltraScale+ FPGAs with HBM Technology Product Overview," [online] Video, Xilinx, Inc. © 2016, retrieved from the Internet: <https://www.xilinx.com/video/fpga/virtex-ultrascale-plus-hbm-devices.html>, 1 pg., Xilinx, Inc., San Jose, CA, USA.
"Supercharge Your AI and Database Applicaitons with Xilinx's HBM-Enabled UltraScale+ Devices Featuring Samsung HBM2," WP508 (v1.1.1) Feb. 1, 2019, 13 pg., Xilinx, Inc., San Jose, CA, USA.

* cited by examiner

*Primary Examiner* — Toan K Le
(74) *Attorney, Agent, or Firm* — Kevin T. Cuenot

(57) ABSTRACT

An integrated circuit (IC) includes a plurality of dies. The IC includes a plurality of memory channel interfaces configured to communicate with a memory, wherein the plurality of memory channel interfaces are disposed within a first die of the plurality of dies. The IC may include a compute array distributed across the plurality of dies and a plurality of remote buffers distributed across the plurality of dies. The plurality of remote buffers are coupled to the plurality of memory channels and to the compute array. The IC further includes a controller configured to determine that each of the plurality of remote buffers has data stored therein and, in response, broadcast a read enable signal to each of the plurality of remote buffers initiating data transfers from the plurality of remote buffers to the compute array across the plurality of dies.

20 Claims, 9 Drawing Sheets

800

Monitor a fill level in a plurality of remote buffers distributed across the plurality of dies, wherein each remote buffer of the plurality of remote buffers is configured to provide data to a compute array also distributed across the plurality of dies
802

Determine that each remote buffer of the plurality of remote buffers is storing data based on the fill level
804

In response to the determining, initiating a data transfer from each remote buffer of the plurality of remote buffers to the compute array across the plurality of dies, wherein the data transfers are synchronized
806

FIG. 8

DATA TRANSFERS BETWEEN A MEMORY AND A DISTRIBUTED COMPUTE ARRAY

TECHNICAL FIELD

This disclosure relates to integrated circuits (ICs) and, more particularly, to data transfers between a memory and a compute array distributed across multiple dies of an IC.

BACKGROUND

A neural network processor (NNP) refers to a type of integrated circuit (IC) having one or more compute arrays capable of implementing a neural network. The compute array(s) are fed data, e.g., weights for the neural network implementation, from a memory. The compute array(s) are fed weights from the memory over a plurality of memory channels in parallel. The data transfers from the memory to the compute array typically suffer from skew. As result, the data reaches different portions of the compute array(s) at different times. Data skew is due, at least in part, to independence among the memory channels while operating in parallel and, in the case of a multi-die IC having compute array(s) distributed across a plurality of dies, the data wave front from each memory channel being orthogonal to the compute array(s) in the multi-die IC. These issues, whether viewed individually or cumulatively, make data transfers from the memory to the compute array unpredictable and lead to inefficient and/or degraded usage of the available bandwidth from the memory.

SUMMARY

An example implementation includes an integrated circuit (IC). The IC includes a plurality of dies. The IC includes a plurality of memory channel interfaces configured to communicate with a memory, wherein the plurality of memory channel interfaces are disposed within a first die of the plurality of dies. The IC may include a compute array distributed across the plurality of dies and a plurality of remote buffers distributed across the plurality of dies. The plurality of remote buffers are coupled to the plurality of memory channels and to the compute array. The IC further includes a controller configured to determine that each of the plurality of remote buffers has data stored therein and, in response, broadcast a read enable signal to each of the plurality of remote buffers initiating data transfers from the plurality of remote buffers to the compute array across the plurality of dies.

Another example implementation includes a controller. The controller is disposed within an IC having a plurality of dies. The controller includes a request controller configured to convert first requests for access to a memory into second requests compliant with an on-chip communication bus, wherein the request controller provides the second requests to a plurality of request buffer-bus master circuit blocks configured to receive data from a plurality of channels of a memory. The controller further includes a remote buffer read address generation unit coupled to the request controller and configured to monitor a fill level in each of a plurality of remote buffers distributed across the plurality of dies. Each remote buffer of the plurality of remote buffers is configured to provide data obtained from respective ones of the plurality of request buffer-bus master circuit blocks to a compute array also distributed across the plurality of dies. In response to determining that each remote buffer of the plurality of remote buffers is storing data based on the fill level, the remote buffer read address generation unit is configured to initiate a data transfer from each remote buffer of the plurality of remote buffers to the compute array across the plurality of dies.

Another example implementation includes a method. The method includes monitoring a fill level in a plurality of remote buffers distributed across the plurality of dies, wherein each remote buffer of the plurality of remote buffers is configured to provide data to a compute array also distributed across the plurality of dies, determining that each remote buffer of the plurality of remote buffers is storing data based on the fill level, and, in response to the determining, initiating a data transfer from each remote buffer of the plurality of remote buffers to the compute array across the plurality of dies.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 8 illustrates an example method of transferring data between a high bandwidth memory and a distributed compute array.

DETAILED DESCRIPTION

Figure 1:
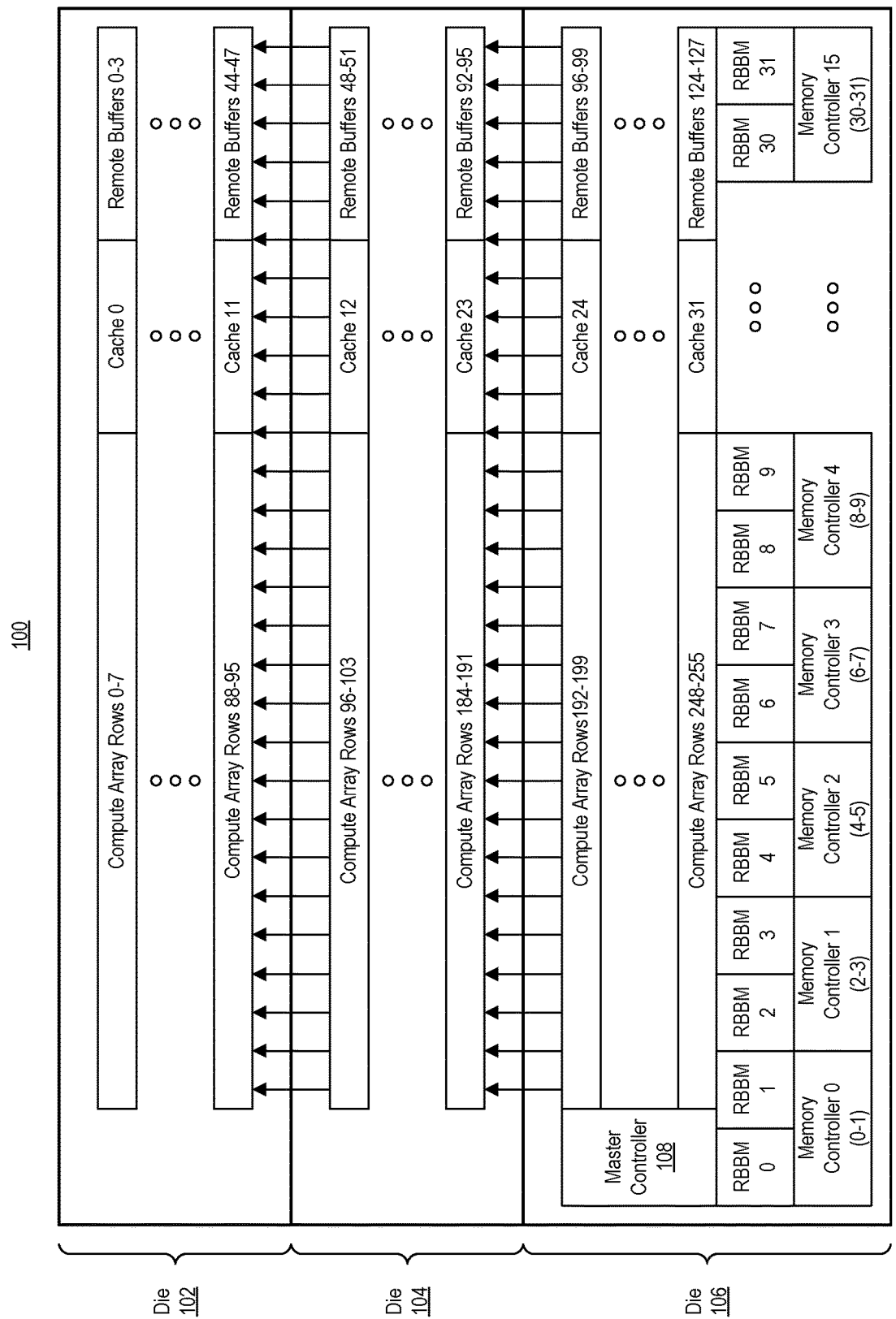
FIG. 1 illustrates an example floorplan for a circuit architecture implemented within an integrated circuit (IC).

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to data transfers between a memory and a compute array distributed across multiple dies of an IC. A neural network processor (NNP) refers to a type of IC having one or more compute arrays capable of implementing a neural network. In the case where the IC is a multi-die IC, the IC may implement a single, larger compute array that is distributed across two or more of the dies of the multi-die IC. Implementing a single, larger compute array in distributed form across multiple dies as opposed to a plurality of smaller, independent compute arrays in the different dies provides certain benefits including, but not limited to, improved latency, improved weight storage capacity, and improved computational efficiency.

The compute array is fed data, e.g., weights for the neural network, from a high bandwidth memory or HBM. For purposes of description, the memory accessed by the memory channels is referred to throughout this disclosure as a "high bandwidth memory" or "HBM" to better differentiate from other types of memories in the circuit architecture such as, for example, buffers and/or queues. It should be appreciated, however, that the HBM may be implemented using any of a variety of different technologies that support multiple independent and parallel memory channels communicatively linking to the example circuit architectures described through suitable memory controllers. Examples of HBMs may include any of a variety of RAM type memories including double data rate RAMs or other suitable memories.

Despite being distributed across multiple dies of the IC, the compute array is seen by the HBM as a single compute array to which weights are to be fed over the available memory channels in parallel. For example, the compute array may be implemented as an array where each die implements one or more rows of the compute array. Each memory channel may provide data to one or more of the rows of the compute array.

In the case of a single compute array distributed over multiple dies, data transfers from the HBM to the compute array often suffer from timing issues. For example, each memory channel typically has its own independent control pins, asynchronous clocks, and refresh sleep mode. These features result in data skew across the memory channels. As a result, different rows of the compute array often receive the data at different times. Data skew is further exacerbated due to different rows of the compute array being located on different dies of the IC and, as such, being different distances from the HBM. For example, the data wave front, e.g., data propagation, from the memory channels is orthogonal to the compute array in the IC. These issues contribute to overall unpredictability of data transfers from the HBM to the compute array.

In accordance with the inventive arrangements described within this disclosure, example circuit architectures are provided that are capable of scheduling read requests for the HBM across memory channels while improving and/or maximizing HBM bandwidth usage. The example circuit architectures are also capable of de-skewing data transfers between the HBM and the compute array. As a result, data may be provided from the HBM to the different rows of the compute array across the dies of the multi-die IC in a synchronized manner with reduced skew. This allows the compute array to remain busy while more fully utilizing read bandwidth of the HBM.

The example circuit architectures are also capable of reducing the overhead and complexity of distributing a compute array over multiple dies of a multi-die IC. The example circuit architectures described herein may be adapted to multi-die ICs with differing numbers of dies therein. As the number of dies in a multi-die IC changes from one model to the next, and/or the area of each die changes, the example circuit architectures described herein may be adapted to such changes to improve data transfers between the HBM and the various dies of the multi-die IC over which the compute array is distributed.

Throughout this disclosure, the Advanced Microcontroller Bus Architecture (AMBA) eXtensible Interface (AXI) (hereafter "AXI") protocol and communication bus is used for purposes of description. AXI defines an embedded microcontroller bus interface for use in establishing on-chip connections between compliant circuit blocks and/or systems. AXI is provided as an illustrative example of a bus interface and is not intended as a limitation of the examples described within this disclosure. It should be appreciated that other similar and/or equivalent protocols, communication buses, bus interfaces, and/or interconnects may be used in lieu of AXI and that the various example circuit blocks and/or signals provided within this disclosure will vary based on the particular protocol, communication bus, bus interface, and/or interconnect that is used.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example floorplan for a circuit architecture implemented in an IC 100. IC 100 is a multi-die IC and includes a compute array. The compute array is distributed across dies 102, 104, and 106 of IC 100. For purposes of illustration, IC 100 is shown with three dies. In other examples, IC 100 may have fewer or more dies than illustrated.

In the example, the compute array is subdivided into 256 compute array rows. Compute array rows 0-95 are implemented in die 102. Compute array rows 96-191 are implemented in die 104. Compute array rows 192-255 are implemented in die 106. The compute array may include digital signal processing (DSP) cascade chains connected together across dies 102, 104, and 106.

Data, e.g., weights, are obtained from an HBM (not shown) that is communicatively linked to IC 100 via a plurality of memory channels. In one aspect, the HBM is implemented in a separate IC (e.g., outside of the package for IC 100) and on a same circuit board as IC 100. In another aspect, the HBM is implemented as another die within IC 100 (e.g., within the same package as IC 100). The HBM may be located along the bottom side of IC 100, e.g., adjacent to the bottom of die 106 from left to right. In the case of some HBMs, the memory channels are referred to as Pseudo Channels (PCs). For purposes of description, the term "memory channel" is used to refer to a memory channel of an HBM and/or a PC of an HBM.

In the example of FIG. 1, die 106 includes 16 memory controllers 0-15. Each memory controller is capable of servicing (e.g., reading and/or writing) two memory channels. The memory controllers 0-15 in FIG. 1 are labeled showing the particular memory channels each memory controller services in parenthesis. For example, memory controller 0 services memory channels 0 and 1; memory controller 1 services memory channels 2-3; etc.

Each memory controller is connected to one or more request buffers and one or more bus master circuits (e.g., AXI masters). In one example implementation shown in FIG. 1, each memory channel couples, through a memory controller, to one request buffer-bus master circuit block. In FIG. 1, each request buffer-bus master circuit block (e.g., where the bus master may be an AXI master) combination is abbreviated as "RBBM circuit block" and illustrated in the figures as "RBBM." Since each memory controller is capable of servicing two memory channels, there are two RBBM circuit blocks directly above and coupled to each memory controller. Each RBBM circuit block is labeled for the particular memory channel serviced by the RBBM circuit block. Accordingly, the example of FIG. 1 includes RBBM circuit blocks 0-15. In the example, the memory controllers and the RBBM circuit blocks are all located in one, e.g., a same, die of IC 100.

Each of dies 102, 104, and 106 includes a plurality of remote buffers. The remote buffers are distributed across dies 102, 104, and 106. In the example of FIG. 1, each RBBM circuit block is connected to a plurality of the remote buffers. In one example, each RBBM circuit block is connected to 4 different remote buffers. For purposes of illustration, RBBM circuit block 0 is connected to, and provides data to, remote buffers 0-3. RBBM circuit block 1 is connected to, and provides data to, remote buffers 4-7; etc. Each of the remaining RBBM circuit blocks may be connected to consecutively numbered groups of 4 remote buffers continuing in die 102 through the remote buffers of dies 104 and 106.

Each of dies 102, 104, and 106 also includes a plurality of caches. In general, the number of caches (e.g., 32) corresponds to the number of memory channels. Each cache is capable of providing data to a plurality of compute array rows. In the example of FIG. 1, each cache is capable of providing data to 8 compute array rows. Die 102 includes caches 0-11 where cache 0 provides data to compute array rows 0-7; cache 1 provides data to compute array rows 8-15; cache 2 provides data to compute array rows 16-23, etc. Die 104 includes caches 12-23 where cache 12 provides data to compute array rows 96-103; cache 13 provides data to compute array rows 104-111; cache 14 provides data to compute array rows 112-119, etc. Die 106 includes caches 24-31 where cache 24 provides data to compute array rows 192-199; cache 25 provides data to compute array rows 200-207; cache 26 provides data to compute array rows 208-215, etc.

In the example, data such as weights may be loaded from the HBM over the 32 memory channels implemented in die 106. Ultimately, the weights are fed into the compute array rows as multiplication operands. The weights enter IC 100 via parallel memory channels through the memory controllers 0-15 in die 106. Within die 106, a per memory channel RBBM circuit block is placed next to each memory channel to handle flow control between each memory channel and the associated compute array rows. The RBBM circuit blocks are controlled by a master controller 108 to perform read and write requests (e.g., "accesses") for the HBM.

In the example of FIG. 1, the memory channels are far away from the remote buffers. Master controller 108 is also far from the memory channels located closer to the right side of die 106. Further, the data wave front, enters the compute array rows (e.g., horizontally) in a direction that is orthogonal to the data wave front entering the IC 100 via the memory controllers (e.g., vertically).

Data read from the HBM is written from the RBBM circuit blocks into respective ones of the remote buffers 0-127 in dies 102, 104, and 106. The read side of each remote buffer (e.g., the side connected to the cache) is controlled by master controller 108. Master controller 108 controls the read side of each remote buffer 0-127 to perform read de-skew operations across dies 102, 104, and 106 and feed data to the respective caches 0-31 for the various compute array rows 0-255.

Master controller 108 is capable of coordinating data transfers into and out from the remote buffers so that the data is de-skewed. By coordinating reads from the remote buffers, master controller 108 ensures that data, e.g., weights, are provided to each compute array row in a synchronized manner. Moreover, master controller 108 is capable of improving and/or maximizing HBM bandwidth usage. This allows the compute array to remain busy while more fully utilizing read bandwidth of the HBM.

As noted, IC 100 may include fewer or more dies than illustrated in FIG. 1. In this regard, the circuit architecture in the example of FIG. 1 is capable of reducing the overhead and complexity of distributing data for a compute array that is distributed over multiple dies of a multi-die IC whether such IC includes fewer or more than three dies. The example architectures described herein may be adapted to multi-die ICs with differing numbers of dies than shown. Further, the size of dies 102, 104, and 106, as shown in FIG. 1, is for purposes of example only to better illustrate the components in each respective die. The dies may be sized the same or have different sizes.

Figure 2:
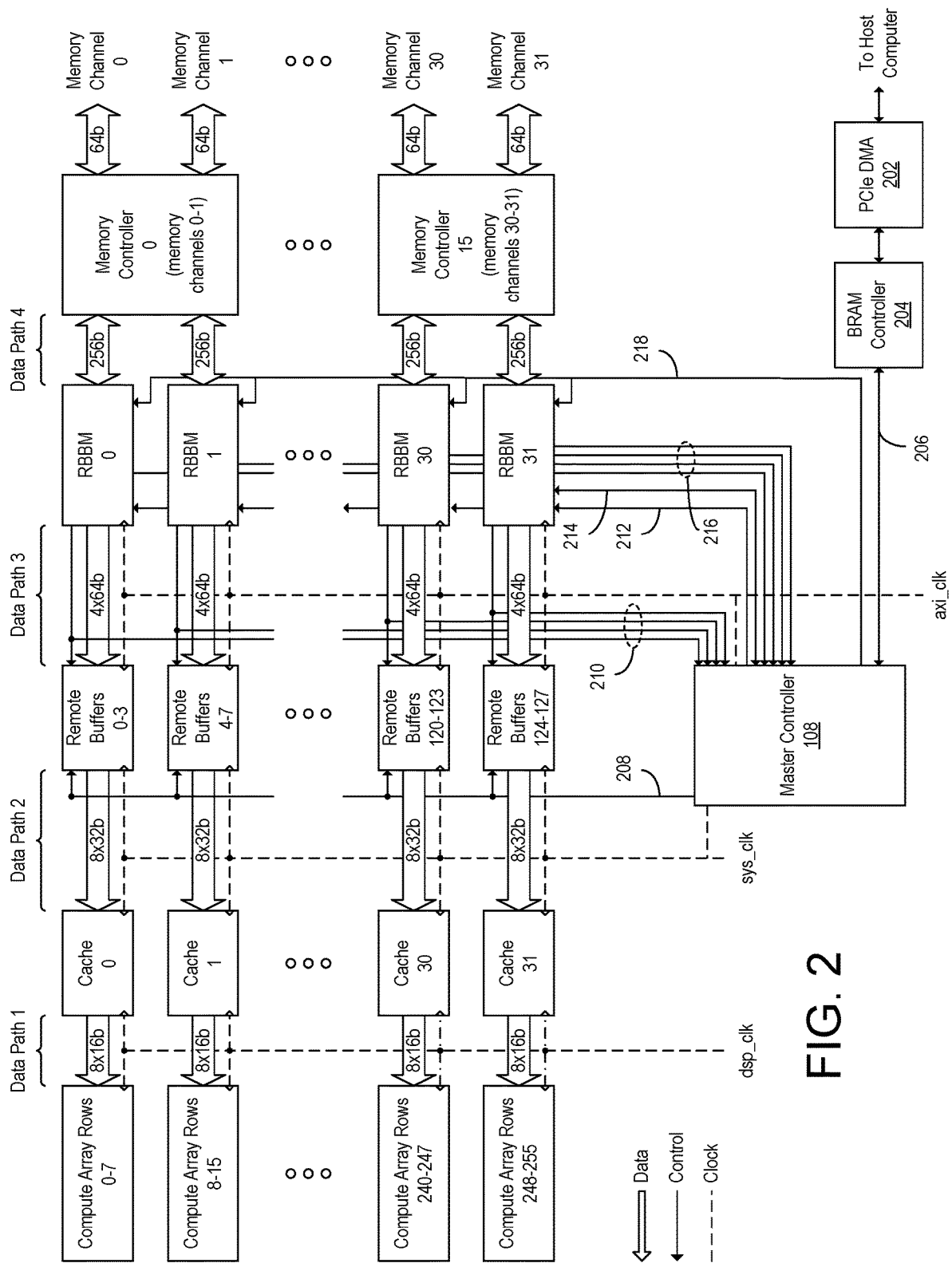
FIG. 2 illustrates an example implementation of the circuit architecture of FIG. 1.

FIG. 2 illustrates an example implementation of the circuit architecture of FIG. 1. In the example of FIG. 2, the die boundaries have been removed. IC 100 may be disposed on a circuit board that is communicatively linked to a host computer via a communication bus. For example, IC 100 may be coupled to the host computer via a Peripheral Component Interconnect Express (PCIe) connection or other suitable connection. IC 100, e.g., die 106, may include a PCIe direct memory access (DMA) circuit 202 to facilitate the PCIe connection. PCIe DMA circuit 202 is connected to a Block Random Access Memory (BRAM) controller 204 via connection 206. In example implementations, one or more of the request buffers of the RBBM circuit blocks and/or the remote buffers are implemented using BRAMs.

Master controller 108 is connected to BRAM controller 204. BRAM controller 204 is capable of operating as an AXI endpoint slave for integration with AXI interconnects and system master devices to communicate to local storage (e.g., BRAM). In the example of FIG. 2, BRAM controller 204 is capable of operating as a bridge between PCIe and master controller 108. In one aspect, master controller 108 is a centralized controller driven by command queues via the host computer-PCIe connection (e.g., as received via PCIe DMA circuit 202 and BRAM controller 204).

Master controller 108 is capable of implementing a plurality of different operations. For example, master controller 108 is capable of implementing a narrow write request to the HBM to initialize the HBM. In that case, master controller 108 is capable of accessing all 32 memory channels of the HBM through AXI master 31 (of RBBM circuit block 31) and memory controller 15 by using global addresses (e.g., only by using global addresses).

Master controller 108 is also capable of implementing a narrow read request from the HBM. In that case, master controller 108 is capable of accessing all 32 memory channels of the HBM through AXI master 31 and memory controller 15 by using global addresses (e.g., only by using global addresses).

Master controller 108 is also capable of implementing a wide read request from the HBM. Master controller 108 is capable of implementing read requests (e.g., both sequential and random) from all 32 memory channels in parallel through bus master circuits 0-31 (e.g., of RBBM circuit blocks 0-31) for memory controllers 1-15 in parallel by using local memory channel addresses.

In the example of FIG. 2, master controller 108 is capable of monitoring and/or tracking a variety of signals. Further, master controller 108 is capable of generating a variety of different signals in response to detecting certain conditions in the monitored signals. For example, master controller 108 is capable of generating signal 208. Signal 208 is a remote buffer read enable signal. Master controller 108 is capable of generating signal 208 and broadcasting signal 208 (e.g., the same signal) to each of the remote buffers 0-127. As such, master controller 108 is capable of read enabling each remote buffer in a synchronized manner to de-skew data being read from the remote buffers and provided to the compute array rows.

Signals 210 are remote buffer write enable signals. Each bus master circuit 0-31 in RBBM circuit blocks 0-31, respectively, is capable of generating a signal 210 to the corresponding remote buffer. Master controller 108 is capable of receiving each of the remote buffer write enable signals, as generated by bus master circuits 0-31 for each of the remote buffers. In one aspect, master controller 108 is capable of monitoring the fill level of each remote buffer by tracking the write enable signal 210 from each remote buffer and the read enable signal 208 provided to each of the remote buffers.

Signal 212 is the same as signal 208. Signal 212, however, is generated in accordance with a different clock signal than signal 208 (e.g., the axi_clk rather than the sys_clk). As such, master controller 108 is capable of providing the remote buffer read enable signal broadcast to each of remote buffers 0-127 also to RBBM circuit blocks 0-31, e.g., the AXI master in each of RBBM circuit blocks 0-31. As such, the remote buffer filling level may also be tracked by a remote buffer pointer manager implemented in each RBBM circuit block locally. The remote buffer pointer manager(s) are described in greater detail in connection with FIG. 5.

Signal 214 represents AXI-AW/W/B signals that master controller 108 is capable of providing to RBBM circuit block 31 to initiate a narrow write as previously described. Within this disclosure, AXI-AW refers to AXI write address signals; AXI-W refers to AXI write data signals; AXI-B refers to AXI write response signals; AXI-AR refers to AXI read address signals; and AXI-R refers to AXI read data signals. AXI Master controller 108 further receives signals 216 from each of RBBM circuit blocks 0-31. Signals 216 may be AR REQ ready signals (e.g., where "AR" refers to "address read"). Master controller 108 is also capable of broadcasting signal 218, e.g., an AR REQ broadcast, to each of RBBM circuit blocks 0-31 to initiate an HBM read.

The example circuit architecture of FIG. 2 includes a plurality of different clock domains. A dsp_clk is used to clock the compute array rows and the output ports of caches 0-31. In one example, dsp_clk is set to 710 MHz. With the 8×16b connections between each of caches 0-31 and the 8 compute array rows fed by each respective cache, a data transfer rate of 0.355 TB/s is achieved (8×16×32 bits*710 MHz).

A sys_clk is used to clock the input ports (e.g., right side) of caches 0-31 connected to the remote buffers and the output ports (e.g., the left side) of the remote buffers 0-127 connected to the caches 0-31. The sys_clk is also used to clock a portion of master controller 108, e.g., in order to broadcast signal 208 to each of the remote buffers. In one example, sys_clk is set to 355 MHz. With the 8×32b connections between remote buffers 0-127 and caches 0-31 shown, a data rate of 0.355 TB/s is achieved (8×32×32 bits*355 MHz). For example, sys_clk may be set to one-half or approximately one-half of the frequency of dsp_clk.

In the example of FIG. 2, caches 0-31 are capable of not only caching data, but also traversing clock domains. More particularly, each of caches 0-31 is capable of receiving data at the sys_clk rate and outputting data to the compute array rows at the dsp_clk rate, e.g., at twice the clock rate of the input. In one or more example implementations, circuitry such as the remote buffers and the RBBM circuit blocks may be implemented in programmable logic that has a slower clock speed than other hardwired circuit blocks such as may be used to implement the compute array rows. Accordingly, caches 0-31 are capable of bridging this difference in clock speed.

An axi_clk is used to clock the input ports (e.g., right side) of the remote buffers and the output ports (e.g., the left side) of the RBBM circuit blocks. The axi_clk is also used to clock a portion of master controller 108, e.g., in order to monitor received signals 210 and 216 and output signals 212, 214, and 218. In one example, axi_clk is set to 450 MHz. With the 4×64b connections between RBBM circuit blocks 0-31 and remote buffers 0-127 shown, a data rate of 0.45 TB/s is achieved (4×64×32 bits*450 MHz).

Each RBBM circuit block is coupled to a corresponding memory controller via a 256b connection achieving a data rate of 0.45 TB/s (32×256 bits*450 MHz). The memory controllers 0-15 may also be clocked at 450 MHz. Each memory controller supports two 64b memory channel connections (e.g., one for each memory channel) providing a data rate of 0.45 TB/s (2048 bits/T*1.8 GT/s).

For purposes of discussion, the term "memory channel interface" is used within this disclosure to refer to a particular RBBM circuit block and a corresponding portion (e.g., a single channel) of a memory controller to which the RBBM circuit block is connected. For example, RBBM circuit block 0 and the portion of memory controller 0 connected to RBBM circuit block 0 (e.g., data buffer 302-0 and request queue 304-0 in reference to FIG. 3) are a memory channel interface while RBBM circuit block 0 and the portion of memory controller 0 connected to RBBM circuit block 1 (e.g., data buffer 302-1 and request queue 304-1) are considered another memory channel interface.

Master controller 108 is capable of generating read and write requests according to HBM read and write commands received via PCIe DMA 202 and BRAM controller 204. Master controller 108 is capable of operating in "hurry up and wait" mode. For example, master controller 108 is capable of sending read requests to request buffers of RBBM circuit blocks 0-31, until the request buffers and data path including the remote buffers is full. In response to each read command, master controller 108 further is capable of initiating a data read operation (e.g., a data transfer) from each remote buffer to the corresponding cache. Further, master controller 108 releases some request buffer space and triggers master controller 108 to generate new read requests to obtain further data from the HBM based on space available in the request buffers.

In one example implementation, the HBM includes 16 banks within each PC and 32 columns within each row. By interleaving banks, up to 16×32×256 bits (128 Kb) may be read by each PC. With the size of BRAMs being 4×36 Kb, one 36 Kb BRAM may be used to buffer two compute array rows. As such, the example circuit architecture of FIG. 2 is capable of reading up to 16 interleaved pages from one PC in a burst length of 512 bits for serving 8 compute array rows at a time.

Figure 3:
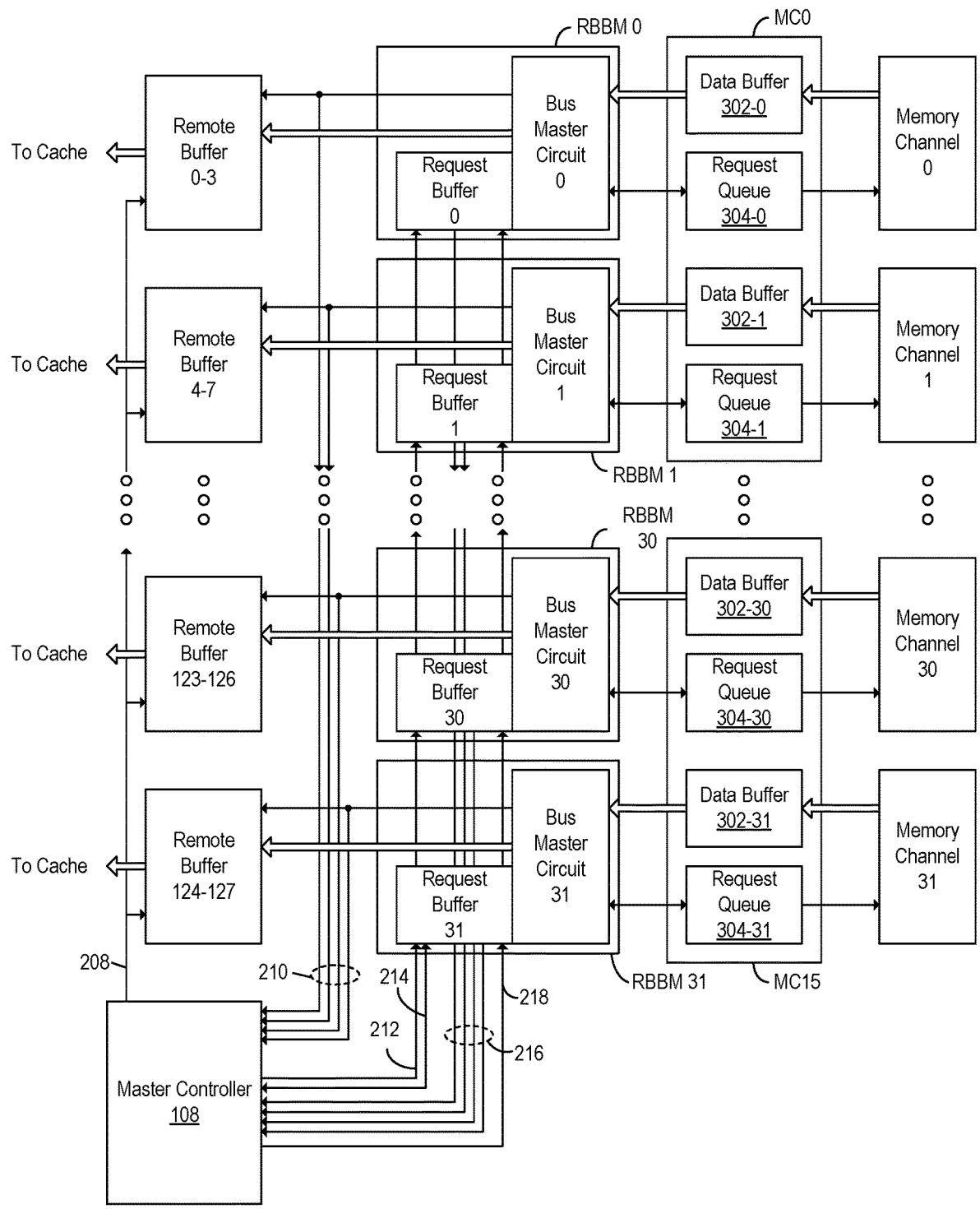
FIG. 3 illustrates another example implementation of the circuit architecture of FIG. 1.

FIG. 3 illustrates another example implementation of the circuit architecture of FIG. 1. In the example of FIG. 3, the die boundaries have been removed. Further, each of memory controllers 0-31 (abbreviated as "MC" in FIG. 3) is coupled to two memory channels. FIG. 3 presents a more detailed view of memory controllers 0-15 and of RBBM circuit blocks 0-31.

In the example of FIG. 3, each memory controller 0-15 services two memory channels. As such, each memory controller 0-15 includes one data buffer 302 for each memory channel serviced and one request queue 304 for each memory channel serviced. For example, memory controller 0 includes data buffer 302-0 and request queue 304-0 to service memory channel 0 and data buffer 302-1 and request queue 304-1 to service memory channel 1. Similarly, memory controller 15 includes data buffer 302-30 and request queue 304-30 to service memory channel 30 and data buffer 302-31 and request queue 304-31 to service memory channel 31.

Using the AXI protocol as an illustrative example, data buffers 302 may be implemented as AXI-R (read) data buffers. Each data buffer 302 may include 64×16 (1024) entries where each entry is 256 bits. Request queues 304 may be implemented as AXI-AR (address read) request queues. Each request queue 304 may include 64 entries. Each data buffer 302 receives data from the corresponding memory channel. Each request queue 304 is capable of providing commands, addresses, and/or control signals to the corresponding memory channel as received from the corresponding AXI master.

Each of RBBM circuit blocks 0-31 includes a bus master circuit and a request buffer. For example, RBBM circuit block 0 includes bus master circuit 0 and request buffer 0. RBBM circuit block 1 includes bus master circuit 1 and request buffer 1. RBBM circuit block 30 includes bus master circuit 30 and request buffer 30. RBBM circuit block 31 includes bus master circuit 31 and request buffer 31. Accordingly, each bus master circuit has a data connection to the corresponding data buffer 302 and a control connection (e.g., for addresses, control signals, and/or commands) to the corresponding request queue 304.

Because of HBM refresh, clock domain crossing, and two memory channels being interleaved in a single memory controller, skew is introduced between data read from the HBM over different memory channels. In the case of memory channel skew, the data read from the HBM over different memory channels are not aligned. Such is the case even if all read requests for all 32 memory channels are issued at the same cycle by each of the 32 AXI masters in parallel. The data skew is due, at least in part, to refresh of the HBM.

Consider an example where the HBM has a 260 ns global refresh period every 3900 ns. In that case, the HBM throughput is limited to 0.42 TB/s ((3900−260)/2900*0.45=0.42) by the refresh command. This also means that every 1755 axi_clk cycles (3900*0.45=1755) there is a refresh window period of 117 axi_clk cycles (260*0.45=117) during which HBM read or write requests cannot be issued over the memory channels to the HBM. Because these refresh windows are not aligned across all 32 memory channels, the maximum skew between any two memory channels is 117 axi_clk cycles when there is no overlapping refresh period between the two memory channels. In the case where the memory controllers are capable of generating a new request every two axi_clk cycles, the skew may be up to 59 (117/2=59) HBM read requests between any two memory channels during a period where one of the two memory channels has already issued 59 read requests while the other memory channel is blocked due to performance of a refresh.

In the example of FIG. 3, each request queue 304 may be used to queue up to 64 HBM read requests initiated by master controller 108 via the corresponding bus master circuit during a refresh command period. In this case, 59 HBM read requests accumulated during the refresh command period can be absorbed in the 64 entry request queue 304. Master controller 108 is capable of monitoring the FIFO ready or full status of each request queue 304 by monitoring signals 216 from the respective RBBM circuit blocks (e.g., AR REQ ready signals 0-31 from all of the memory channels for the HBM for wide read requests). In response to determining that space is available in each of data buffers 302, e.g., based on the status of each request queue 304, master controller 108 is capable of generating a new HBM read request (e.g., for each memory channel) and broadcasting such a request to each of the memory controllers 0-15 (e.g., via the bus master circuit). That is, master controller 108 sends the HBM read request to the request buffers. Each bus master circuit services the requests from the local request buffer. In the case where any one of request queues 304 is full, master controller 108 does not generate a new HBM read request.

In terms of the fill level of each of request queues 304 across each of the 32 memory channels, two cases may occur for HBM wide read requests. The first case corresponds to a state where the circuit architecture is ready for new HBM read requests. In the first case, buffer space is available in each (e.g., all) request queues 304 to receive a new HBM read request from master controller 108. The second case corresponds to a state where the circuit architecture is not ready for new HBM read requests. In the second case, one or more of request queues 304 are full and at least one other request queue 304 is neither full nor empty. The situation where some request queues 304 are full and others empty does not occur since the maximum skew (e.g., 59) between any two memory channels is less than the buffer size of request queues 304 (e.g., 64). In the second case, since there are still HBM read requests pending in all request queues 304, HBM throughput is not affected by serving new requests from master controller 108.

Referring to both FIGS. 2 and 3, there are total of 32 data streams. Each data stream is 256 bits wide and extends from a memory channel to the corresponding remote buffers. As illustrated in FIG. 1, some remote buffers are located in die 102 or 104, while other remote buffers are located in die 106 in closer proximity to master controller 108. In some example arrangements, since the data path for each memory channel is 256 bits wide, hardware resources may be minimized by keeping these data paths relatively short.

Figure 4:
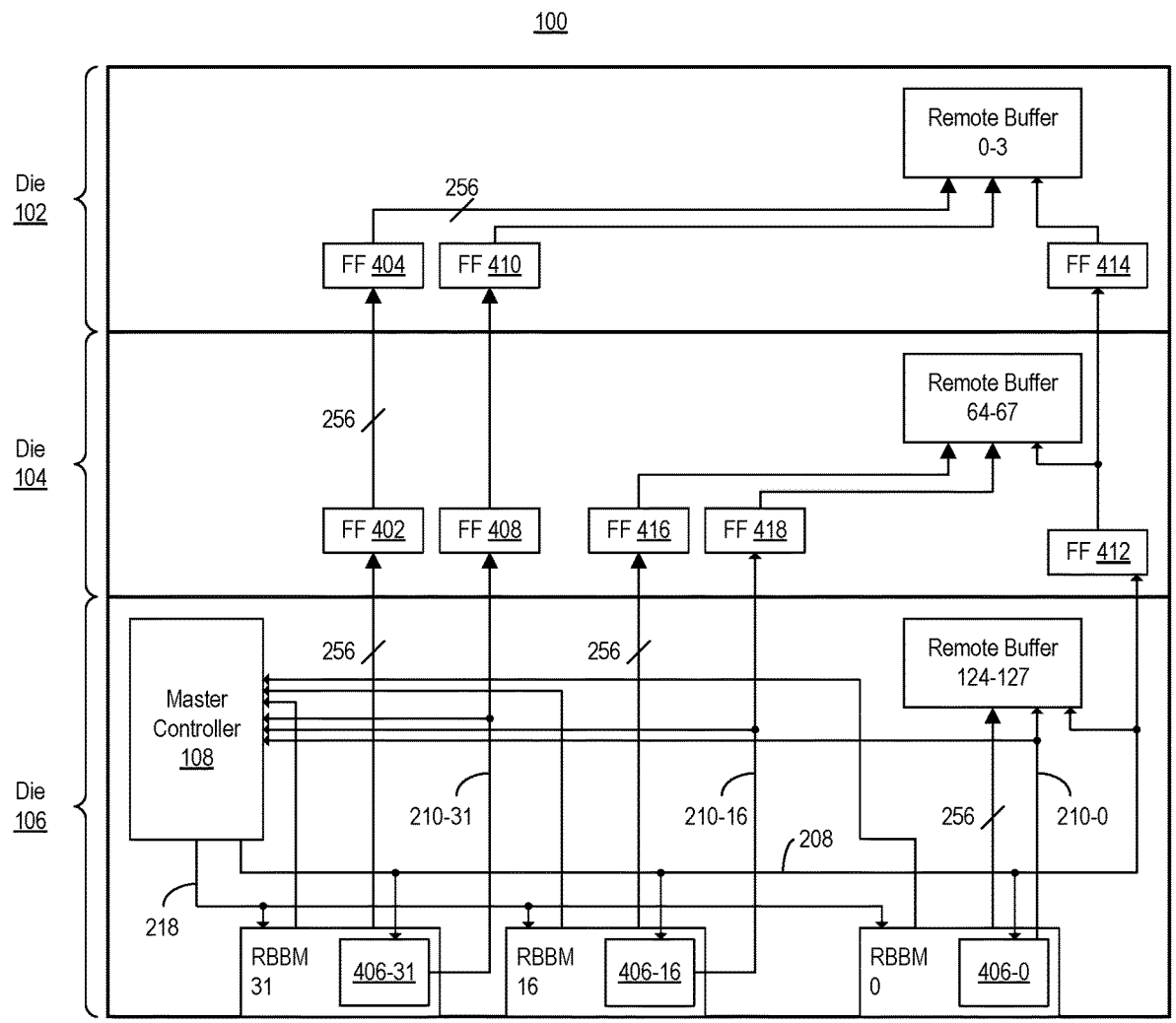
FIG. 4 illustrates an example of a balanced tree structure used to implement the circuit architecture of FIG. 1.

FIG. 4 illustrates an example of a balanced tree structure used to implement the circuit architecture of FIG. 1. The balanced tree structure is used to broadcast HBM wide read requests from master controller 108 to the memory controllers.

As shown in the example of FIG. 4, master controller 108 broadcasts signal 218 (AR REQ broadcast signal) from left to right to the various RBBM circuit blocks. For purposes of illustration, only RBBM circuit blocks 31, 16, and 0 are shown. The arrival time of signal 218 at each RBBM circuit block is aligned at the same axi_clk cycle. Further, master controller 108 is capable of broadcasting signal 208 (e.g., remote buffer read enable) to each of the remote buffers. For purposes of illustration, only remote buffers 0-3, 64-67, and 124-127 are shown.

In the example of FIG. 4, each RBBM circuit block includes a remote buffer pointer manager 406 (shown as 406-31, 406-16, and 406-0). Remote buffer point manager 406 may be included as part of the request buffer or implemented separately from the request buffer within each respective RBBM circuit block. Each remote buffer pointer manager 406 is capable of receiving signal 208 for purposes of tracking the fill level of the corresponding remote buffer. Further, each remote buffer pointer manager 406 is capable of outputting signal 210 (e.g., remote buffer write enable signals 210-31, 210-16, and 210-0) to the corresponding remote buffers.

For example, flip-flop (FF) 402 in die 104 receives a 256 bit wide data signal from RBBM circuit block 31 in die 106. FF 402 passes the data to FF 404 in die 102. FF 404 passes the data to remote buffers 0-3. Remote buffer point manager 406-31 is capable of outputting control signal 210-31 to FF 408 in die 104. FF 408 outputs control signal 210-31 to FF 410 in die 102. FF 410 outputs control signal 210-31 to remote buffers 0-3. Master controller 108 generates and broadcasts signal 208, e.g., the remote buffer ready signal, to remote buffers 124-127 in die 106. Signal 208 continues to FF 412 in die 104. FF 412 outputs signal 208 to remote buffers 64-67. FF 412 outputs signal 208 to FF 414 in die 102. FF 414 provides signal 208 to remote buffers 0-3.

FF 416 in die 104 receives a 256 bit wide data signal from RBBM circuit block 16 in die 106. FF 416 passes the data to remote buffers 64-67. Remote buffer point manager 406-16 is capable of outputting control signal 210-16 to FF 418 in die 104. FF 418 outputs control signal 210-16 to remote buffers 64-67.

RBBM circuit block 0 outputs a 256 bit wide data signal directly to remote buffers 124-127 in die 106. Remote buffer pointer manager 406-0 outputs control signal 210-0 directly to remote buffers 124-127 within die 106.

In general, the skew addressed by the inventive arrangements described within this disclosure has several different components. For example, the skew includes a component caused by HBM refresh and components caused by data propagation delays such as, for example, signals crossing clock domains, data latency along different paths in the same die, data latency along different paths across different dies, and the like. HBM refreshing is the largest contributor to the skew. This aspect of the skew is handled, e.g., de-skewed, largely by the read data buffers inside the memory controllers. The other skew components, which contribute less than the HBM skew to the overall skew even when considered collectively, may be handled by the remote buffers. For this reason, there is no need to balance HBM read data latency from the memory controllers to the remote buffers across the 32 memory channels. Minimum pipeline stages may be used to send data from the memory controllers to the remote buffers on dies 102, 104, and 106 because the remote buffers have enough storage space to tolerate remote buffer write side skew introduced by the described latency imbalance.

The example of FIG. 4 also illustrates how the remote buffers are capable of creating back pressure on the memory controllers for the respective memory channels. The back pressure is created, at least in part, by generating each of control signals 210 locally at each respective remote buffer pointer manager 406 inside each RBBM circuit block in close proximity to the memory channels. Further, master controller 108 broadcasts common signal 208 using the balanced tree structure.

The read and write pointers for the remote buffers are generated at each respective remote buffer across dies 102, 104, and 106. Signals 210 should match the delay of the remote buffer write data. Because of skew between the write side of the remote buffers receiving data from the various memory channels and the skew between signals 210, the write data latency, and the remote data read enable latency, the remote buffer back pressure may include some buffer margin space to absorb those skews. Signals 210 and signals 216 (not shown in FIG. 4) are propagated back to master controller 108. The delay of such signals may be balanced to ensure master controller 108 captures the signals at the same cycle to generate both the new HBM read request and signal 208.

Figure 5:
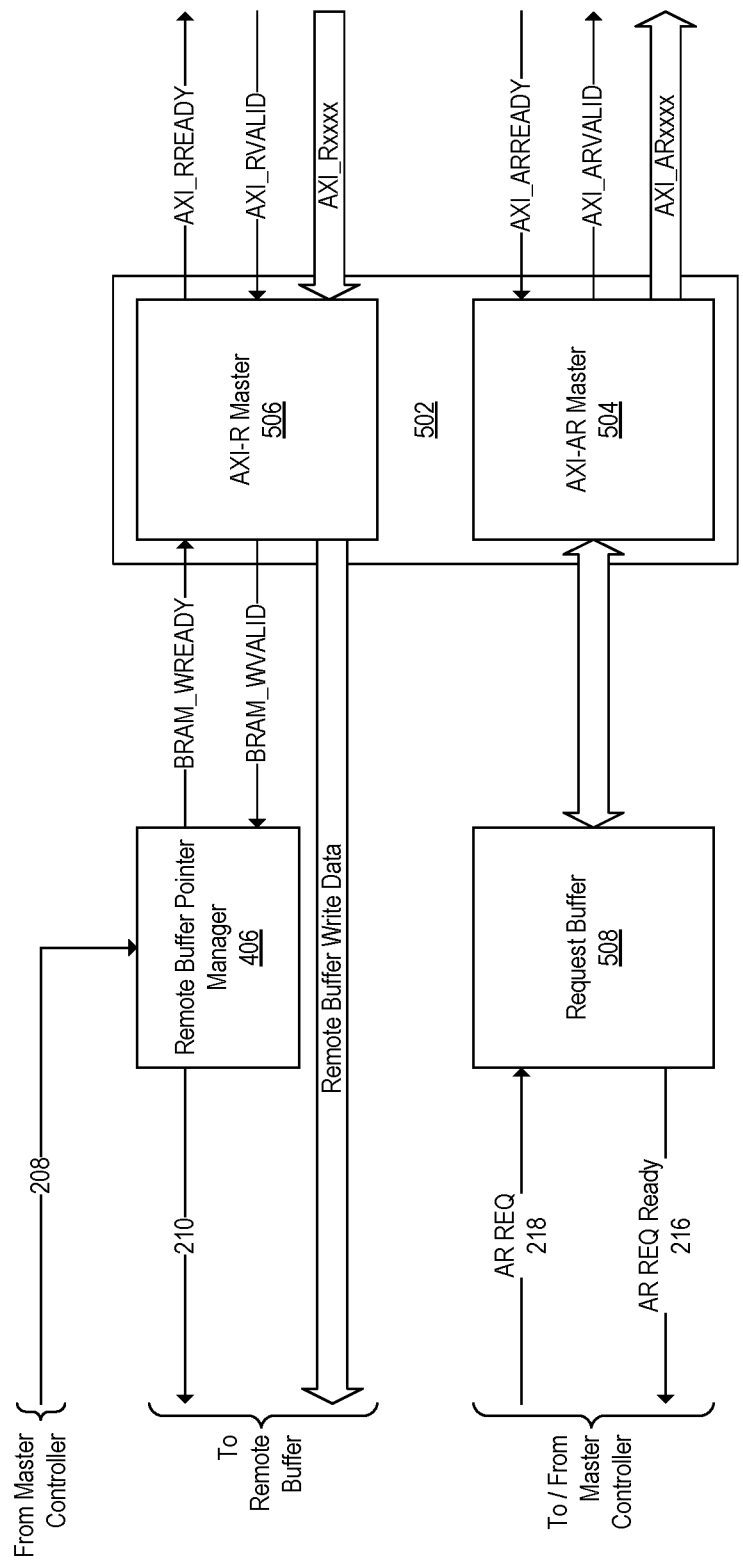
FIG. 5 illustrates an example implementation of a request buffer-bus master (RBBM) circuit block as described within this disclosure.

FIG. 5 illustrates an example implementation of an RBBM circuit block as described within this disclosure. In the example of FIG. 5, bus master circuit 502 includes two read channels. AXI master 502 includes an AXI-AR master 504 capable of handling read address data and an AXI-R master 506 capable of handling read data. The other three AXI write channels: AXI-AW (write address), AXI-W (write data) and AXI-B (write response) may be handled inside of master controller 108. For purposes of illustration, the signal label "AXI_Rxxxx" is intended to refer to the AXI signals from the relevant communication specification with the prefix "AXI_R", while the signal label "AXI_ARxxxx" is intended to refer to the AXI signals from the relevant communication specification with the prefix "AXI_AR".

Request buffer 508 is the request buffer previously described as being part of the RBBM circuit block and is used to handle HBM read request queue back pressure round trip delay between the AR REQ ready (e.g., signal 216) and the AR REQ signals (e.g., signal 218). The depth of request buffer 508, for example, should be greater than the back pressure round trip delay (e.g., less than 32).

The AR REQ (address read request) signal 218 may specify a read starting address which is a 23 bit local address for a wide read request from master circuit 108 over memory controllers 0-15 or a 28 bit global address for a narrow read request from master circuit 108 conducted over memory controller 15 only. The AR REQ signal 218 may also include a read transaction identifier that is 6 bits for narrow and wide identification and specifies other stream related information. The AR REQ signal 218 may also specify a read burst length that is 4 bits supporting burst lengths of up to 16 bytes depending on the particular AXI protocol used. In one example implementation, three combinatorial logic block memories (CLBMs), where each CLBM is a 32×14 dual-port RAM, may be used to implement a 32×42 FIFO for request buffer 508. In that case, request buffer 508 is capable of serving AXI-AR master 504 with a new read request every axi_clk cycle.

Remote buffer pointer manager 406 is used to generate signal 210 (remote buffer write enable) for read data received from the HBM. Remote buffer pointer manager 406 is further capable of generating remote buffer back pressure locally to the AXI-R (read data) channel corresponding to AXI-R master 506. Because of skew between different memory channels, each remote buffer pointer manager 406 is capable of maintaining the fill level of the corresponding remote buffer by keeping track of remote buffer write enables and remote buffer read enables. Each remote buffer pointer manager 406 is capable of incrementing the remote buffer filling level once HBM read data is valid by assertion of the BRAM_WVALID signal. Each remote buffer pointer manager 406 further is capable of decrementing the remote buffer filling level upon receiving signal 208 (remote buffer read enable) broadcast from master controller 108. Remote buffer pointer manager 406 is further capable of generating a remote buffer back pressure signal (e.g., BRAM_WREADY) for each memory channel based on a predefined remote buffer filling level. The remote buffer filling threshold for generating the back pressure signal should take into account both skew between remote buffer write side latency across the memory channels and skew between the read and write side of the remote buffers.

As illustrated, AXI-R master 506 is capable of outputting data that may be provided to the corresponding remote buffer(s).

Figure 6:
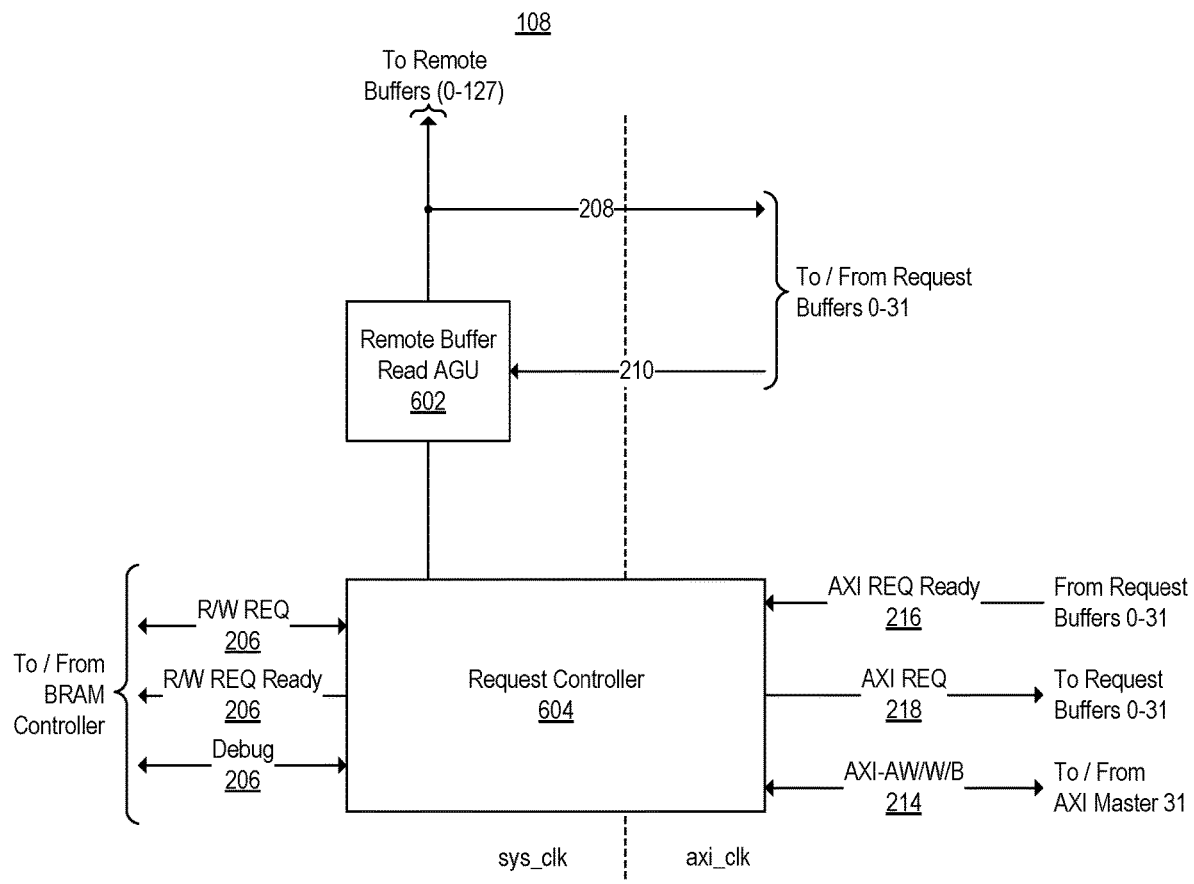
FIG. 6 illustrates an example implementation of a master controller.

FIG. 6 illustrates an example implementation of master controller 108. In the example of FIG. 6, master controller 108 includes a remote buffer read address generation unit (remote buffer read AGU) 602 coupled to a request controller 604. In the example of FIG. 6, master controller 108 converts both narrow read requests and wide read requests from BRAM controller 204 into AXI-AR requests for request buffers 0-31 (narrow read for 31 only). Master controller 108 further converts narrow write requests into AXI-W and AXI-AW requests for master circuit 31 only.

In one aspect, at the same time, for AXI-AR requests, the expected read burst length from AXI-R is sent from request controller 604 to remote buffer read AGU 602. Remote buffer read AGU 602 is capable of queuing the received expected read burst lengths therein, e.g., in a queue or memory therein. Remote buffer read AGU 602 is capable of maintaining the remote buffer filling level for each of the remote buffers by tracking all of signals 210 (e.g., all of the remote buffer write enables 0-31) and signal 208 (e.g., the common remote buffer read enable). Remote buffer read AGU 602 is capable of triggering, e.g., continuing to trigger, the remote buffer read operation (e.g., asserting signal 208) so long as the remote buffer filling level of all remote buffers exceeds the expected burst lengths stored in the queue. Signal 208 is used by each of the request buffers for creating remote buffer back pressure for each of the memory channels and by each of the remote buffers for de-skew. Because the expected burst length is predetermined and queued inside remote buffer read AGU 602, the reorder function, which allows the output order to differ from the input order, is disabled by forcing the AXI IDs to one same value.

Figure 7:
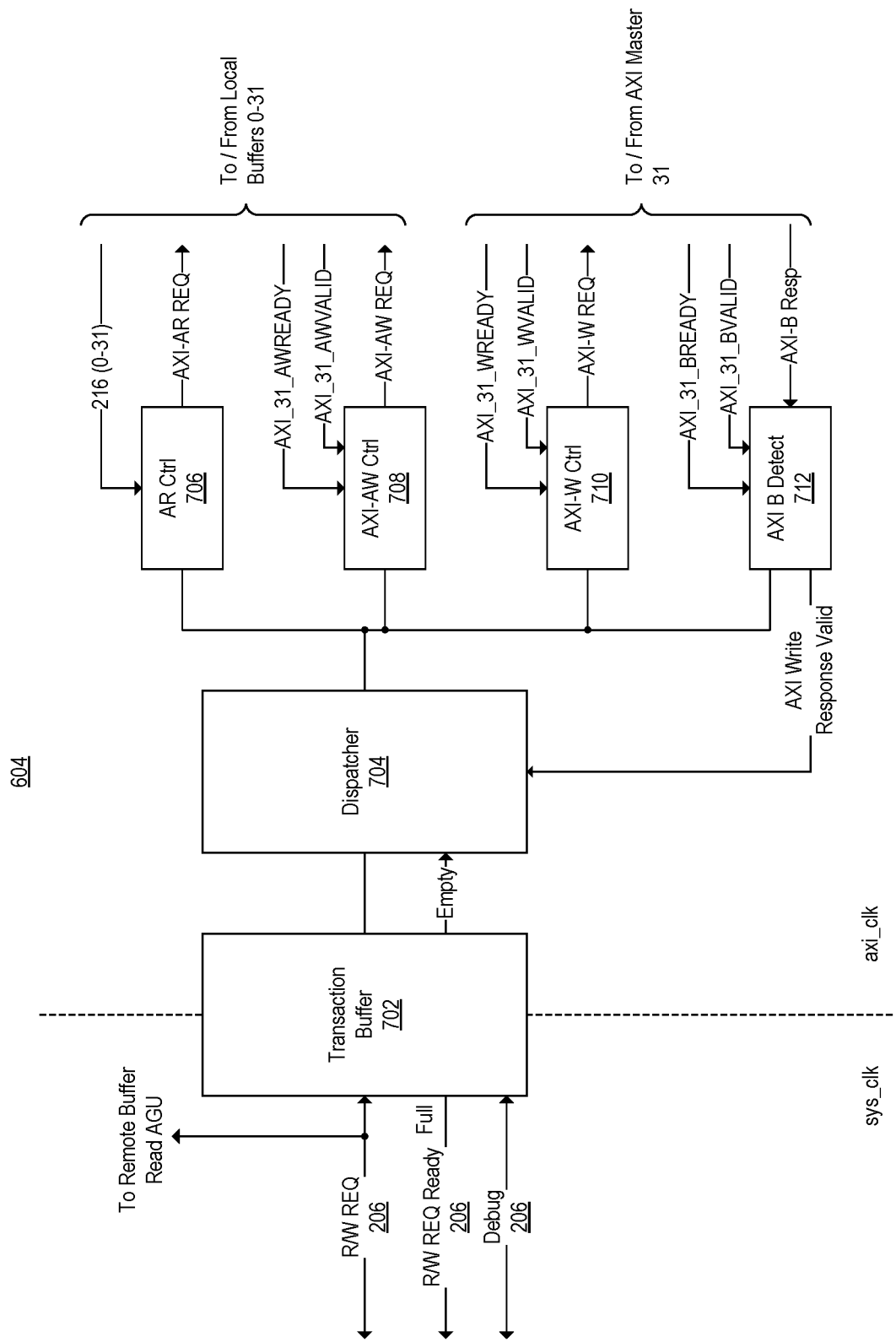
FIG. 7 illustrates an example implementation of a request controller.

FIG. 7 illustrates an example implementation of request controller 604 of FIG. 6. In the example of FIG. 7, request controller 604 includes a transaction buffer 702 and a dispatcher 704. Transaction buffer 702 uses the sys_clk as the write clock and the axi_clk for the read clock to decouple the two asynchronous clock domains. Request controller 604 further includes a plurality of controllers shown as AR (address read) controller 706, AXI-AW (address write) controller 708, AXI-W (write) controller 710, and AXI B detector 712 capable of detecting a valid response on the AXI B or AXI response channel.

In the example of FIG. 7, AR controller 706 is capable of checking the request buffer back pressures as indicated by signals 216 (e.g., AR REQ ready signals 0-31). AR controller 706 is capable of checking AR REQ ready signals 0-31 at the same time, e.g., concurrently. In one aspect, AR controller 706 only generates the AXI-AR REQ (an HBM read request) when space is available in each of the request buffers.

For AXI read related channels such as AXI-AR and AXI-R, the request buffers are required between the AXI master and request controller 604. For AXI write related channels such as AXI-AW, AXI-W, and AXI-B, request controller 604 (e.g., controllers 708, 710, and 712) communicates with AXI master 31 corresponding to memory controller 15 directly. When both the AXI ready indication and the AXI valid indication (AXI-XX-AWREADY/AWVALID or AXI-XX-WREADY/WVALID) are asserted in the same cycle, request controller 604 outputs the AXI request and reads a new request from the buffer at the same time.

Dispatcher 704 is capable of routing (e.g., dispatching) different AXI transactions from transaction buffer 702 to the appropriate ones of controllers 706, 708, 710, and/or 712 based on transaction type. Dispatcher 704 also schedules AXI access sequences between AXI writes and AXI reads; and, schedules AXI access sequences between successive AXI write operations. For example, dispatcher 704 does not issue a new AXI-AR request or a new AXI-AW transaction until a response from the previous AXI write transaction is received.

Referring to FIGS. 6 and 7, remote buffer read AGU 602 receives each remote buffer write enable corresponding to each of the memory channels and the common remote buffer read enable. Throughput of the system may be measured at either the write side of the remote buffers or the read side of the remote buffers by counting data transfer elements with performance counters.

FIG. 8 illustrates a method 800 of transferring data between an HBM and a distributed compute array. Method 800 may be performed using a circuit architecture (referred to as a "system" in reference to FIG. 8) as described within this disclosure in connection with FIGS. 1-7.

In block 802, the system is capable of monitoring a fill level in a plurality of remote buffers distributed across the plurality of dies. Each of the remote buffers of the plurality of remote buffers may be configured to provide data to a compute array also distributed across the plurality of dies. In block 804, the system is capable of determining that each remote buffer of the plurality of remote buffers is storing data based on the fill level. In block 806, the system, in response to the determining, is capable of initiating a data transfer from each remote buffer of the plurality of remote buffers to the compute array across the plurality of dies. The data transfers may be synchronized (e.g., de-skewed). For example, the data transfers occurring in each die are synchronized. Minimal pipelining is used to facilitate the synchronization from one die to another. The data, as output from the remote buffers to the compute array rows, is further de-skewed.

In one aspect, the system initiates the data transfer from each remote buffer by broadcasting a read enable signal to each remote buffer of the plurality of remote buffers. The read enable signal is a common read enable signal broadcast to each remote buffer.

In another aspect, the system is capable of monitoring fill level by tracking a plurality of write enables corresponding to the plurality of remote buffers on a one-to-one basis and tracking a read enable that is common to each of the plurality of remote buffers.

In particular implementations, the system is capable of receiving data, within a plurality of RBBM circuit blocks disposed in a first die of the plurality of dies, from an HBM over a plurality of respective memory channels. The plurality of RBBM circuit blocks provide data to respective ones of the plurality of remote buffers.

The system is also capable of converting first requests for access to the memory into second requests compliant with an on-chip communication bus and providing the second requests to communication bus master circuits corresponding to each of the plurality of RBBM circuit blocks.

The system is capable of providing data from each of the plurality of remote buffers to a plurality of cache circuit blocks distributed across the plurality of dies, wherein each cache circuit block is connected to at least one remote buffer of the plurality of remote buffers and to the compute array. Each cache circuit block may be configured to receive the data from a selected remote buffer at a first clock rate and output the data to the compute array at a second clock rate exceeding the first clock rate.

Figure 9:
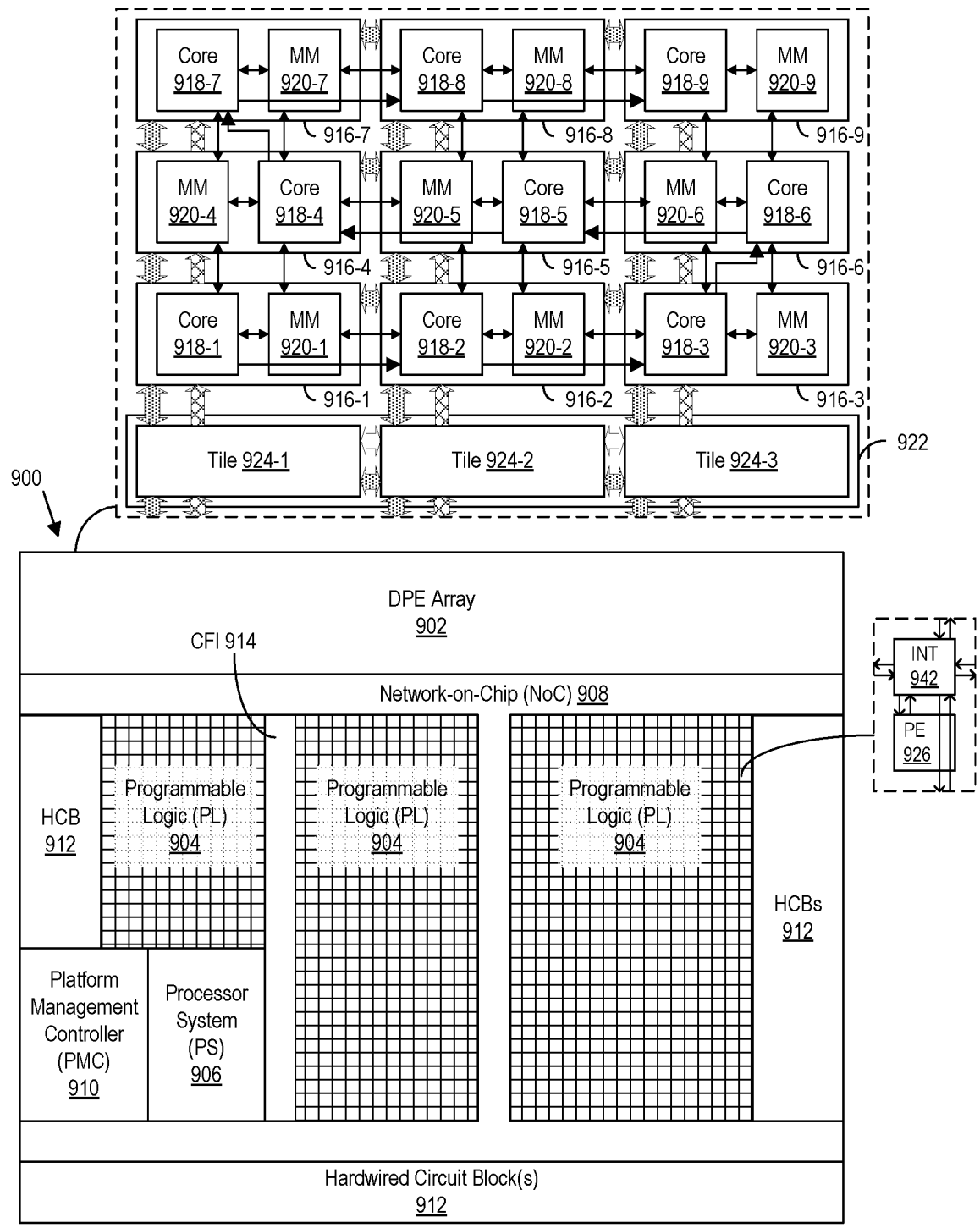
FIG. 9 illustrates an example architecture for an IC.

FIG. 9 illustrates an example architecture for a programmable device 900. Programmable device 900 is an example of a programmable IC and an adaptive system. In one aspect, programmable device 900 is also an example of a System-on-Chip (SoC). Programmable device 900 may be implemented using a plurality of interconnected dies where the various programmable circuit resources illustrated in FIG. 9 are implemented across the different interconnected dies. In one example, programmable device 900 may be used to implement the example circuit architectures described herein in connection with FIGS. 1-8.

In the example, programmable device 900 includes a data processing engine (DPE) array 902, programmable logic (PL) 904, a processor system (PS) 906, a Network-on-Chip (NoC) 908, a platform management controller (PMC) 910, and one or more hardwired circuit blocks 912. A configuration frame interface (CFI) 914 is also included.

DPE array 902 is implemented as a plurality of interconnected and programmable data processing engines (DPEs) 916. DPEs 916 may be arranged in an array and are hardwired. Each DPE 916 can include one or more cores 918 and a memory module (abbreviated "MM" in FIG. 9) 920. In one aspect, each core 918 is capable of executing program code stored in a core-specific program memory contained within each respective core (not shown). Each core 918 is capable of directly accessing the memory module 920 within the same DPE 916 and the memory module 920 of any other DPE 916 that is adjacent to the core 918 of the DPE 916 in the up, down, left, and right directions. For example, core 918-5 is capable of directly reading memory modules 920-5, 920-8, 920-6, and 920-2. Core 918-5 sees each of memory modules 920-5, 920-8, 920-6, and 920-2 as a unified region of memory (e.g., as a part of the local memory accessible to core 918-5). This facilitates data sharing among different DPEs 916 in DPE array 902. In other examples, core 918-5 may be directly connected to memory modules 920 in other DPEs.

DPEs 916 are interconnected by programmable interconnect circuitry. The programmable interconnect circuitry may include one or more different and independent networks. For example, the programmable interconnect circuitry may include a streaming network formed of streaming connections (shaded arrows), a memory mapped network formed of memory mapped connections (cross-hatched arrows).

Loading configuration data into control registers of DPEs 916 by way of the memory mapped connections allows each DPE 916 and the components therein to be controlled independently. DPEs 916 may be enabled/disabled on a per-DPE basis. Each core 918, for example, may be configured to access the memory modules 920 as described or only a subset thereof to achieve isolation of a core 918 or a plurality of cores 918 operating as a cluster. Each streaming connection may be configured to establish logical connections between only selected ones of DPEs 916 to achieve isolation of a DPE 916 or a plurality of DPEs 916 operating as a cluster. Because each core 918 may be loaded with program code specific to that core 918, each DPE 916 is capable of implementing one or more different kernels therein.

In other aspects, the programmable interconnect circuitry within DPE array 902 may include additional independent networks such as a debug network that is independent (e.g., distinct and separate from) the streaming connections and the memory mapped connections, and/or an event broadcast network. In some aspects, the debug network is formed of memory mapped connections and/or is part of the memory mapped network.

Cores 918 may be directly connected with adjacent cores 918 via core-to-core cascade connections. In one aspect, core-to-core cascade connections are unidirectional and direct connections between cores 918 as pictured. In another aspect, core-to-core cascade connections are bidirectional and direct connections between cores 918. Activation of core-to-core cascade interfaces may also be controlled by loading configuration data into control registers of the respective DPEs 916.

In an example implementation, DPEs 916 do not include cache memories. By omitting cache memories, DPE array 902 is capable of achieving predictable, e.g., deterministic, performance. Further, significant processing overhead is avoided since maintaining coherency among cache memories located in different DPEs 916 is not required. In a further example, cores 918 do not have input interrupts. Thus, cores 918 are capable of operating uninterrupted. Omitting input interrupts to cores 918 also allows DPE array 902 to achieve predictable, e.g., deterministic, performance.

SoC interface block 922 operates as an interface that connects DPEs 916 to other resources of programmable device 900. In the example of FIG. 9, SoC interface block 922 includes a plurality of interconnected tiles 924 organized in a row. In particular embodiments, different architectures may be used to implement tiles 924 within SoC interface block 922 where each different tile architecture supports communication with different resources of programmable device 900. Tiles 924 are connected so that data may be propagated from one tile to another bi-directionally. Each tile 924 is capable of operating as an interface for the column of DPEs 916 directly above.

Tiles 924 are connected to adjacent tiles, to DPEs 916 immediately above, and to circuitry below using the streaming connections and the memory mapped connections as shown. Tiles 924 may also include a debug network that connects to the debug network implemented in DPE array 902. Each tile 924 is capable of receiving data from another source such as PS 906, PL 904, and/or another hardwired circuit block 912. Tile 924-1, for example, is capable of providing those portions of the data, whether application or configuration, addressed to DPEs 916 in the column above to such DPEs 916 while sending data addressed to DPEs 916 in other columns on to other tiles 924, e.g., 924-2 or 924-3, so that such tiles 924 may route the data addressed to DPEs 916 in their respective columns accordingly.

In one aspect, SoC interface block 922 includes two different types of tiles 924. A first type of tile 924 has an architecture configured to serve as an interface only between DPEs 916 and PL 904. A second type of tile 924 is has an architecture configured to serve as an interface between DPEs 916 and NoC 908 and also between DPEs 916 and PL 904. SoC interface block 922 may include a combination of tiles of the first and second types or tiles of only the second type.

In one aspect, DPE array 902 may be used to implement the compute arrays described herein. In that regard, DPE array 902 may be distributed over a plurality of different dies.

PL 904 is circuitry that may be programmed to perform specified functions. As an example, PL 904 may be implemented as field programmable gate array type of circuitry. PL 904 can include an array of programmable circuit blocks. As defined herein, the term "programmable logic" means circuitry used to build reconfigurable digital circuits. Programmable logic is formed of many programmable circuit blocks sometimes referred to as "tiles" that provide basic functionality. The topology of PL 904 is highly configurable unlike hardwired circuitry. Each programmable circuit block of PL 904 typically includes a programmable element 926 (e.g., a functional element) and a programmable interconnect 942. The programmable interconnects 942 provide the highly configurable topology of PL 904. The programmable interconnects 942 may be configured on a per wire basis to provide connectivity among the programmable elements 926 of programmable circuit blocks of PL 904 and is configurable on a per-bit basis (e.g., where each wire conveys a single bit of information) unlike connectivity among DPEs 916, for example.

Examples of programmable circuit blocks of PL 904 include configurable logic blocks having look-up tables and registers. Unlike hardwired circuitry described below and sometimes referred to as hard blocks, these programmable circuit blocks have an undefined function at the time of manufacture. PL 904 may include other types of programmable circuit blocks that have also provide basic and defined functionality with more limited programmability. Examples of these circuit blocks may include digital signal processing blocks (DSPs), phase lock loops (PLLs), and block random access memories (BRAMs). These types of programmable circuit blocks, like others in PL 904, are numerous and intermingled with the other programmable circuit blocks of PL 904. These circuit blocks may also have an architecture that generally includes a programmable interconnect 942 and a programmable element 926 and, as such, are part of the highly configurable topology of PL 904.

Prior to use, PL 904, e.g., the programmable interconnect and the programmable elements, must be programmed or "configured" by loading data referred to as a configuration bitstream into internal configuration memory cells therein. The configuration memory cells, once loaded with a configuration bitstream, define how PL 904 is configured, e.g., the topology, and operates (e.g., particular functions performed). Within this disclosure, a "configuration bitstream" is not equivalent to program code executable by a processor or computer.

In one aspect, PL 904 may be used to implement one or more of the components illustrated in FIGS. 1-7. For example, the various buffers, queues, and/or controllers may be implemented using PL 904. In this regard, PL 904 may be distributed across multiple dies.

PS 906 is implemented as hardwired circuitry that is fabricated as part of programmable device 900. PS 906 may be implemented as, or include, any of a variety of different processor types each capable of executing program code. For example, PS 906 may be implemented as an individual processor, e.g., a single core capable of executing program code. In another example, PS 906 may be implemented as a multi-core processor. In still another example, PS 906 may include one or more cores, modules, co-processors, I/O interfaces, and/or other resources. PS 906 may be implemented using any of a variety of different types of architectures. Example architectures that may be used to implement PS 906 may include, but are not limited to, an ARM processor architecture, an x86 processor architecture, a graphics processing unit (GPU) architecture, a mobile processor architecture, a DSP architecture, combinations of the foregoing architectures, or other suitable architecture that is capable of executing computer-readable instructions or program code.

NoC 908 is a programmable interconnecting network for sharing data between endpoint circuits in programmable device 900. The endpoint circuits can be disposed in DPE array 902, PL 904, PS 906, and/or selected hardwired circuit blocks 912. NoC 908 can include high-speed data paths with dedicated switching. In an example, NoC 908 includes one or more horizontal paths, one or more vertical paths, or both horizontal and vertical path(s). The arrangement and number of regions shown in FIG. 9 is merely an example. NoC 908 is an example of the common infrastructure that is available within programmable device 900 to connect selected components and/or subsystems.

Within NoC 908, the nets that are to be routed through NoC 908 are unknown until a user circuit design is created for implementation within programmable device 900. NoC 908 may be programmed by loading configuration data into internal configuration registers that define how elements within NoC 908 such as switches and interfaces are configured and operate to pass data from switch to switch and among the NoC interfaces to connect the endpoint circuits. NoC 908 is fabricated as part of programmable device 900 (e.g., is hardwired) and, while not physically modifiable, may be programmed to establish connectivity between different master circuits and different slave circuits of a user circuit design. NoC 908, upon power-on, does not implement any data paths or routes therein. Once configured by PMC 910, however, NoC 908 implements data paths or routes between endpoint circuits.

PMC 910 is responsible for managing programmable device 900. PMC 910 is a subsystem within programmable device 900 that is capable of managing the other programmable circuit resources across the entirety of programmable device 900. PMC 910 is capable of maintaining a safe and secure environment, booting programmable device 900, and managing programmable device 900 during normal operations. For example, PMC 910 is capable of providing unified and programmable control over power-up, boot/configuration, security, power management, safety monitoring, debugging, and/or error handling for the different programmable circuit resources of programmable device 900 (e.g., DPE array 902, PL 904, PS 906, and NoC 908). PMC 910 operates as a dedicated platform manager that decouples PS 906 and from PL 904. As such, PS 906 and PL 904 may be managed, configured, and/or powered on and/or off independently of one another.

In one aspect, PMC 910 is capable of operating as a Root-of-Trust for the entirety of programmable device 900. As an example, PMC 910 is responsible for authenticating and/or validating device images containing configuration data for any of the programmable resources of programmable device 900 that may be loaded into programmable device 900. PMC 910 further is capable of protecting programmable device 900 against tampering during operation. By operating as the Root-of-Trust for programmable device 900, PMC 910 is capable of monitoring operation of PL 904, PS 906, and/or any other programmable circuit resources that may be included in programmable device 900. The Root-of-Trust capabilities, as performed by PMC 910, are distinct and separate from PS 906 and PL 904 and/or any operations performed by the PS 906 and/or PL 904.

In one aspect, PMC 910 is operated on a dedicated power supply. As such, PMC 910 is powered by a power supply that is separate and independent from the power supply of PS 906 and the power supply of PL 904. This power independence allows PMC 910, PS 906, and PL 904 to be protected from one another in terms of electrical noise and glitches. Further, one or both of PS 906 and PL 904 may be powered down (e.g., suspended or placed in hibernate mode) while PMC 910 continues to operate. This capability allows any portions of programmable device 900, e.g., PL 904, PS 906, NoC 908, etc., that have been powered down to wake and be restored to an operational state more quickly and without the need for the entirety of programmable device 900 to undertake a complete power-up and boot process.

PMC 910 may be implemented as a processor with dedicated resources. PMC 910 may include multiple redundant processors. The processors of PMC 910 are capable of executing firmware. Use of firmware supports configurability and segmentation of global features of programmable device 900 such as reset, clocking, and protection to provide flexibility in creating separate processing domains (which are distinct from "power domains" that may be subsystem-specific). Processing domains may involve a mixture or combination of one or more different programmable circuit resources of programmable device 900 (e.g., wherein the processing domains may include different combinations or devices from DPE array 902, PS 906, PL 904, NoC 908, and/or other hardwired circuit blocks 912).

Hardwired circuit blocks 912 include special-purpose circuit blocks fabricated as part of programmable device 900. Though hardwired, hardwired circuit blocks 912 may be configured by loading configuration data into control registers to implement one or more different modes of operation. Examples of hardwired circuit blocks 912 may include input/output (I/O) blocks, transceivers for sending and receiving signals to circuits and/or systems external to programmable device 900, memory controllers, or the like. Examples of different I/O blocks may include single-ended and pseudo differential I/Os. Examples of transceivers may include high-speed differentially clocked transceivers. Other examples of hardwired circuit blocks 912 include, but are not limited to, cryptographic engines, digital-to-analog converters (DACs), analog-to-digital converters (ADCs), and the like. In general, hardwired circuit blocks 912 are application-specific circuit blocks.

In one aspect, hardwired circuit blocks 912 may be used to implement one or more of the components illustrated in FIGS. 1-7. For example, the various memory controllers and/or other controllers each may be implemented as a hardwired circuit block 912. In this regard, one or more of hardwired circuit blocks 912 may be distributed across multiple dies.

CFI 914 is an interface through which configuration data, e.g., a configuration bitstream, may be provided to PL 904 to implement different user-specified circuits and/or circuitry therein. CFI 914 is coupled to and accessible by PMC 910 to provide configuration data to PL 904. In some cases, PMC 910 is capable of first configuring PS 906 such that PS 906, once configured by PMC 910, may provide configuration data to PL 904 via CFI 914. In one aspect, CFI 914 has a built in cyclic redundancy checking (CRC) circuitry (e.g., CRC 32-bit circuitry) incorporated therein. As such, any data that is loaded into CFI 914 and/or read back via CFI 914 may be checked for integrity by checking the values of codes attached to the data.

The various programmable circuit resources illustrated in FIG. 9 may be programmed initially as part of a boot process for programmable device 900. During runtime, the programmable circuit resources may be reconfigured. In one aspect, PMC 910 is capable of initially configuring DPE array 902, PL 904, PS 906, and NoC 908. At any point during runtime, PMC 910 may reconfigure all or a portion of programmable device 900. In some cases, PS 906 may configure and/or reconfigure PL 904 and/or NoC 908 once initially configured by PMC 910.

The example programmable device described in connection with FIG. 9 is for purposes of illustration only. In other example implementations, the example circuit architectures described herein may be implemented in a custom multi-die IC, e.g., an application-specific IC having multiple dies, and/or in a programmable IC such as a Field Programmable Gate Array (FPGA) having multiple dies. Further, the particular technology used to communicatively link the dies within the IC package, e.g., a common silicon interposer with wiring coupling the dies, a multi-chip module, three or more stacked dies, or the like, is not intended to be limiting of the inventive arrangements described herein.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the term "approximately" means nearly correct or exact, close in value or amount but not precise. For example, the term "approximately" may mean that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention. As defined herein, the term "user" means a human being.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the term "processor" means at least one hardware circuit. The hardware circuit may be configured to carry out instructions contained in program code. The hardware circuit may be an integrated circuit or embedded in an integrated circuit.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

An IC can include a plurality of dies. The IC can include a plurality of memory channel interfaces configured to communicate with a memory, wherein the plurality of memory channel interfaces are disposed within a first die of the plurality of dies. The IC can include a compute array distributed across the plurality of dies and a plurality of remote buffers distributed across the plurality of dies. The plurality of remote buffers can be coupled to the plurality of memory channels and to the compute array. The IC also can include a controller configured to determine that each of the plurality of remote buffers has data stored therein and, in response, broadcast a read enable signal to each of the plurality of remote buffers initiating data transfers from the plurality of remote buffers to the compute array across the plurality of dies.

The data transfers may be synchronized to de-skew the data conveyed by the respective transfers.

The foregoing and other implementations can each optionally include one or more of the following features, alone or in combination. One or more implementations may include all the following features in combination.

In one aspect, the IC can include a plurality of request buffer-bus master circuit blocks disposed in the first die, wherein each request buffer-bus master circuit blocks is connected to one memory channel interface of the plurality of memory channel interfaces and to at least one remote buffer of the plurality of remote buffers.

In another aspect, the IC can include a plurality of cache circuit blocks distributed across the plurality of dies, wherein each cache circuit block is connected to at least one remote buffer of the plurality of remote buffers and to the compute array.

In another aspect, each cache circuit block can be configured to receive the data from a selected remote buffer at a first clock rate and output the data to the compute array at a second clock rate exceeding the first clock rate.

In another aspect, the compute array includes a plurality of rows, wherein each die of the plurality of dies includes two or more rows of the plurality of rows.

In another aspect, each memory channel interface can provide data from the memory to two or more rows of the compute array.

In another aspect, the memory is a high bandwidth memory. In another aspect, the memory is a double data rate random access memory.

In another aspect, the compute array implements a neural network processor and the data specifies weights applied by the neural network processor.

In another aspect, each memory channel interface provides data from the memory to two or more rows of the compute array.

In one aspect, a controller is disposed within an IC having a plurality of dies. The controller includes a request controller configured to convert first requests for access to a memory into second requests compliant with an on-chip communication bus, wherein the request controller provides the second requests to a plurality of request buffer-bus master circuit blocks configured to receive data from a plurality of channels of a memory. The controller further includes a remote buffer read address generation unit coupled to the request controller and configured to monitor a fill level in each of a plurality of remote buffers distributed across the plurality of dies. Each remote buffer of the plurality of remote buffers is configured to provide data obtained from respective ones of the plurality of request buffer-bus master circuit blocks to a compute array also distributed across the plurality of dies. In response to determining that each remote buffer of the plurality of remote buffers is storing data based on the fill level, the remote buffer read address generation unit is configured to initiate a data transfer from each remote buffer of the plurality of remote buffers to the compute array across the plurality of dies.

The data transfers may be synchronized to de-skew the data conveyed by the respective transfers.

The foregoing and other implementations can each optionally include one or more of the following features, alone or in combination. One or more implementations may include all the following features in combination.

In one aspect, the request controller can receive the first requests at a first clock frequency and provides the second requests at a second clock frequency.

In another aspect, the remote buffer read address generation unit can monitor the fill level in each of the plurality of remote buffers by tracking a plurality of write enables corresponding to the plurality of remote buffers and tracking a read enable that is common to each of the plurality of remote buffers.

A method can include monitoring a fill level in a plurality of remote buffers distributed across the plurality of dies, wherein each remote buffer of the plurality of remote buffers is configured to provide data to a compute array also distributed across the plurality of dies. The method also can include determining that each remote buffer of the plurality of remote buffers is storing data based on the fill level and, in response to the determining, initiating a data transfer from each remote buffer of the plurality of remote buffers to the compute array across the plurality of dies.

The data transfers may be synchronized to de-skew the data conveyed by the respective transfers.

The foregoing and other implementations can each optionally include one or more of the following features, alone or in combination. One or more implementations may include all the following features in combination.

In one aspect, the initiating the data transfer from each remote buffer includes broadcasting a read enable signal to each remote buffer of the plurality of remote buffers.

In another aspect, the monitoring the fill level can include tracking a plurality of write enables corresponding to the plurality of remote buffers and tracking a read enable that is common to each of the plurality of remote buffers.

In another aspect, the method can include receiving, within a plurality of request buffer-bus master circuit blocks disposed in a first die of the plurality of dies, data from a memory over a plurality of respective memory channels, wherein the plurality of request buffer-bus master circuit blocks provide data to respective ones of the plurality of remote buffers.

In another aspect, the method can include converting first requests for access to the memory into second requests compliant with an on-chip communication bus and providing the second requests to communication bus master circuits corresponding to each of the plurality of request buffers.

In another aspect, the method can include providing data from each of the plurality of remote buffers to a plurality of cache circuit blocks distributed across the plurality of dies, wherein each cache circuit block is connected to at least one remote buffer of the plurality of remote buffers and to the compute array.

In another aspect, each cache circuit block can be configured to receive the data from a selected remote buffer at a first clock rate and output the data to the compute array at a second clock rate exceeding the first clock rate.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. An integrated circuit including a plurality of dies, the integrated circuit comprising:

a plurality of memory channel interfaces configured to communicate with a memory, wherein the plurality of memory channel interfaces are disposed within a first die of the plurality of dies;

a compute array distributed across the plurality of dies;

a plurality of remote buffers distributed across the plurality of dies, wherein the plurality of remote buffers are coupled to the plurality of memory channels and to the compute array; and a controller configured to determine that each of the plurality of remote buffers has data stored therein and, in response, broadcast a read enable signal to each of the plurality of remote buffers initiating data transfers from the plurality of remote buffers to the compute array across the plurality of dies.

2. The integrated circuit of claim 1, further comprising:

a plurality of request buffer-bus master circuit blocks disposed in the first die, wherein each request buffer-bus master circuit block is connected to one memory channel interface of the plurality of memory channel interfaces and to at least one remote buffer of the plurality of remote buffers.

3. The integrated circuit of claim 1, further comprising:

a plurality of cache circuit blocks distributed across the plurality of dies, wherein each cache circuit block is connected to at least one remote buffer of the plurality of remote buffers and to the compute array.

4. The integrated circuit of claim 3, wherein each cache circuit block is configured to receive the data from a selected remote buffer at a first clock rate and output the data to the compute array at a second clock rate exceeding the first clock rate.

5. The integrated circuit of claim 1, wherein the compute array comprises a plurality of rows, wherein each die of the plurality of dies includes two or more rows of the plurality of rows.

6. The integrated circuit of claim 5, wherein each memory channel interface provides data from the memory to two or more rows of the compute array.

7. The integrated circuit of claim 1, wherein the memory is a high bandwidth memory.

8. The integrated circuit of claim 1, wherein the memory is a double data rate random access memory.

9. The integrated circuit of claim 1, wherein the compute array implements a neural network processor and the data specifies weights applied by the neural network processor.

10. The integrated circuit of claim 1, wherein each memory channel interface provides data from the memory to two or more rows of the compute array.

11. A controller disposed within an integrated circuit having a plurality of dies, the controller comprising:

a request controller configured to convert first requests for access to a memory into second requests compliant with an on-chip communication bus, wherein the request controller provides the second requests to a plurality of request buffer-bus master circuit blocks configured to receive data from a plurality of channels of the memory;

a remote buffer read address generation unit coupled to the request controller and configured to monitor a fill level in each of a plurality of remote buffers distributed across the plurality of dies, wherein each remote buffer of the plurality of remote buffers is configured to provide data obtained from respective ones of the plurality of request buffer-bus master circuit blocks to a compute array also distributed across the plurality of dies; and wherein, in response to determining that each remote buffer of the plurality of remote buffers is storing data based on the fill level, the remote buffer read address generation unit is configured to initiate a data transfer from each remote buffer of the plurality of remote buffers to the compute array across the plurality of dies.

12. The controller of claim 11, wherein the request controller receives the first requests at a first clock frequency and provides the second requests at a second clock frequency.

13. The controller of claim 11, wherein the remote buffer read address generation unit monitors the fill level in each of the plurality of remote buffers by tracking a plurality of write enables corresponding to the plurality of remote buffers and tracking a read enable that is common to each of the plurality of remote buffers.

14. A method, comprising:
monitoring a fill level in a plurality of remote buffers distributed across the plurality of dies, wherein each remote buffer of the plurality of remote buffers is configured to provide data to a compute array also distributed across the plurality of dies;
determining that each remote buffer of the plurality of remote buffers is storing data based on the fill level; and
in response to the determining, initiating a data transfer from each remote buffer of the plurality of remote buffers to the compute array across the plurality of dies.

15. The method of claim 14, wherein the initiating the data transfer from each remote buffer comprises:
broadcasting a read enable signal to each remote buffer of the plurality of remote buffers.

16. The method of claim 14, wherein the monitoring the fill level comprises:
tracking a plurality of write enables corresponding to the plurality of remote buffers and tracking a read enable that is common to each of the plurality of remote buffers.

17. The method of claim 14, further comprising:
receiving, within a plurality of request buffer-bus master circuit blocks disposed in a first die of the plurality of dies, data from a memory over a plurality of respective memory channels, wherein the plurality of request buffer-bus master circuit blocks provide data to respective ones of the plurality of remote buffers.

18. The method of claim 17, further comprising:
converting first requests for access to the memory into second requests compliant with an on-chip communication bus; and
providing the second requests to request buffers of the plurality of request buffer-bus master circuit blocks, wherein in each request buffer-bus master circuit block, a bus master circuit services the second requests from the request buffer.

19. The method of claim 14, further comprising:
providing data from each of the plurality of remote buffers to a plurality of cache circuit blocks distributed across the plurality of dies, wherein each cache circuit block is connected to at least one remote buffer of the plurality of remote buffers and to the compute array.

20. The method of claim 19, wherein each cache circuit block is configured to receive the data from a selected remote buffer at a first clock rate and output the data to the compute array at a second clock rate exceeding the first clock rate.

\* \* \* \* \*